(12) United States Patent
Emmett et al.

(10) Patent No.: US 6,332,946 B1
(45) Date of Patent: Dec. 25, 2001

(54) METHOD FOR ASSEMBLING A MULTI-LAYERED CERAMIC PACKAGE

(75) Inventors: Michael Emmett, Poughkeepsie; Ronald L. Hering, Pleasant Valley; Eric B. Hultmark, Wappinger Falls; Howard D. Hutchinson, Beacon, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/464,053

(22) Filed: Dec. 15, 1999

Related U.S. Application Data

(62) Division of application No. 09/041,459, filed on Mar. 12, 1998, now Pat. No. 6,112,795.

(51) Int. Cl.[7] .............................. B32B 18/00; H02L 23/34
(52) U.S. Cl. ...................... 156/299; 257/726; 257/727
(58) Field of Search .................................... 156/299, 300, 156/556, 563, 583.3; 269/40, 135, 238; 100/228; 29/738, 739, 740, 841; 257/724, 726, 727

(56) References Cited

U.S. PATENT DOCUMENTS

| | | | |
|---|---|---|---|
| 3,164,749 | 1/1965 | Berge et al. | 317/101 |
| 3,644,979 | 2/1972 | Bura | 29/281.3 |
| 4,582,245 | * 4/1986 | Cartwright | 228/180.2 |
| 5,088,190 | * 2/1992 | Malhi et al. | 29/843 |
| 5,163,363 | 11/1992 | Gilgert et al. | 100/35 |
| 5,170,326 | 12/1992 | Meny et al. | 361/395 |
| 5,179,501 | 1/1993 | Ocken et al. | 361/388 |
| 5,198,066 | 3/1993 | Cederstrom | 156/566 |
| 5,216,581 | 6/1993 | Fisher et al. | 361/392 |
| 5,224,023 | 6/1993 | Smith et al. | 361/412 |
| 5,265,322 | 11/1993 | Fisher et al. | 290/848 |
| 5,332,463 | 7/1994 | Eberlein et al. | 156/566 |
| 5,434,362 | 7/1995 | Klosowisk et al. | 174/254 |
| 5,499,444 | 3/1996 | Doane, Jr. et al. | 294/830 |
| 5,525,760 | 6/1996 | Rohatgi et al. . | |
| 5,527,421 | 6/1996 | Uehara et al. | 156/299 |
| 5,646,446 | 7/1997 | Nicewarner, Jr. et al. | 257/723 |
| 5,716,493 | 2/1998 | Vongfuangfoo et al. | 156/300 |
| 6,229,324 | * 5/2001 | Akram et al. | 324/758 |

\* cited by examiner

*Primary Examiner*—Michael W. Ball
*Assistant Examiner*—Barbara J. Musser
(74) *Attorney, Agent, or Firm*—Ratner & Prestia; Tiffany L. Townsend, Esq.

(57) ABSTRACT

A book-like fixture and method for assembly of a plurality of multi-layered ceramic packages including a substrate and a cap. The fixture has a baseplate, a removable tray, an alignment plate for precisely aligning the caps with the substrates, a compression plate, and a plurality of compression devices designed to uniformly distribute compressive force on the plurality of packages. The fixture is preferably adapted for use of removable trays conforming to the Joint Electronics Design Engineering Council Tray Standard. The compression devices preferably have a spring, preferably a detachable leaf spring, and a compression plate placed over each cap. The structure of the fixture allows replacement of the springs and other modifications to allow assembly of multi-layered ceramic packages of differing dimensions. The structure of the fixture also allows stacking one on top of another.

10 Claims, 4 Drawing Sheets

METHOD FOR ASSEMBLING A MULTI-LAYERED CERAMIC PACKAGE

This application is a divisional of U.S. patent application Ser. No. 09/041,459, filed on Mar. 12, 1998, now U.S. Pat. No. 6,112,795.

TECHNICAL FIELD

This invention relates to a fixture and related method for assembly of multi-layered ceramic packages, specifically a fixture and related method capable of assembling a plurality of multi-layered ceramic packages having precise tolerances in a high-volume, high-yield assembly process.

BACKGROUND OF THE INVENTION

Multi-layered ceramic (MLC) packages, specifically single chip modules (SCM) and multi-chip modules (MCM), are used in a number of applications. Such modules generally consist of a substrate and a cap that must be bonded together to a specified dimensional tolerance, usually using adhesives that are heat-cured. Industry competitiveness demands low-cost, high-volume, high-yield assembly of such modules.

Stamped fixtures, typically of stainless steel, such as "Auer Boats" manufactured by AUER Precision Company, Inc. of Mesa, Ariz., are prevalent in the industry as fixtures used for such assembly. Such fixtures incur high initial tooling costs, however, for even minor variations in MLC package design, and are not compatible with conveyor equipment designed to work with a tool set complying with the Joint Electronic Device Engineering Council (JEDEC) Standards. Use of typical stamped fixtures requires additional handling which is labor intensive and also results in yield loss due to handling defects. In addition, loose cap-to-substrate alignment tolerances decrease the usable substrate area.

The configuration of a typical stamped stainless steel fixture of the prior art for assembly of an MLC package is shown in FIG. 1. A typical MLC package consists of a substrate 100 and cap 102, the substrate having mounted upon it an integrated circuit chip 104 and having pins 106 extending from the bottom of the substrate.

To assemble the MLC package, the substrate containing the chip is set in a base 110 aligned by guides 111. An alignment plate 112 is aligned on the substrate using alignment pins 114 attached to the alignment plate, each pin comprising a spacer portion 116 and a pin portion 118 adapted to fit in hole 119 in base 110. Substrate 100 and chip 104 are typically prepared with chip underfill applied around and wicking under chip 104, thermally conductive paste applied on top of chip 104, and seal adhesive placed on the surface of substrate 100 where cap 102 will contact the substrate. The underfill protects the chip-substrate interface and prevents oxidation of the solder used to attach the chip pins to the substrate. The thermally conductive paste creates a conductive pathway from the top of the chip to the cap, so that heat may be dissipated away from the chip through the cap. Finally, the seal adhesive bonds around the perimeter of the cap to seal the area inside the cap to protect it from oxidation. Cap 102 is then placed on top of the substrate so prepared.

Pressure is then applied to press the substrate against the cap, using clip 120. Clip 120 consists of a bridge 122 having tabs 124 punched therethrough, and prongs 126 attached at either end of bridge 122. Each prong 126 has an upper stop tab 128, a lower stop tab 130, and an angled end 132. Tabs 124 are spaced to hold the ends of leaf spring 134 therebetween. The compression force, usually 2 to 10 pounds, imparted by the spring serves to "squish" the paste layer on top of the chip to conform it to the space between the chip and the cap, thus assuring a good conductive connection and cap seal.

The clip 120 is inserted manually by squeezing the prongs 126 slightly toward one another and inserting them through alignment plate holes 136 and baseplate holes 138 thus compressing spring 134. Once the prongs 126 have completely penetrated holes 138, the prongs are allowed to spring back away from one another, and the lower tabs 130 hold the prongs into place to prevent the force of compressed spring 134 from retracting the clip. Upper tabs 128 prevent the prongs from being inserted too far into holes 138 such that too much compressive force would be imparted on cap 102. The MLC package so assembled is then put into an oven to heat cure the seal adhesive. Cured modules then must be removed manually from the fixture.

A typical stamped stainless steel fixture of the prior art might accommodate anywhere from one to ten such MLC packages, but typically no more than five on a single base with a single corresponding alignment plate. One clip for each MLC package on the base must be inserted and removed manually, however, for each MLC package. Manual removal of the clip requires compressing prongs 126 toward each other a sufficient amount to clear tabs 128 and 130 through holes 138 and 136. This operation usually requires handling the clip at ends 132, sometimes causing finger damage to pins 106 if mishandled.

Another difficulty associated with the stamped fixtures of the prior art is that they cannot be stacked on top of one another. Because the oven curing step may often take three to four hours, the ability to maximize the number of fixtures in a single oven can dramatically increase throughput without requiring investment in additional ovens.

In addition, because the fixtures of the prior art are manufactured by a stamped metal process having inherently loose tolerances, the alignment between the base and the substrate may not meet the tight tolerances of customer specifications. As the industry strives to ever increase the amount of performance per size of unit, more of the substrate closer to the edges is typically used for functional design, and thus close tolerances of cap-to-substrate alignment have become more critical.

Finally, such fixtures must be re-tooled to accommodate even minor variations in MLC package width, length, or height, a serious drawback considering the common height variation in MLC packaging. In addition, a fixture is needed that uses industry standard JEDEC trays.

It is an object of the present invention, therefore, to provide a fixture flexible enough to handle the variations in package dimensions from product line to product line, capable of high-volume production with high yield conforming to precise dimensional tolerances, and strong enough to withstand constant manufacturing use.

SUMMARY OF THE INVENTION

To achieve this and other objects, and in view of its purposes, the present invention provides a fixture for the assembly of a plurality of multi-layered ceramic packages, or modules, each package comprising a substrate and a cap. An alternate embodiment of the fixture of the present invention may be used to assemble only a single package.

The fixture comprises a baseplate, a removable tray located on the baseplate and having a plurality of cavities each adapted to accept a substrate, a package alignment plate removably located on top of the tray, a compression plate pivotably attached to the baseplate, and a plurality of compression devices. The alignment plate has a plurality of openings each adapted to fit a cap. The compression plate pivots in relation to the baseplate between an open position and a closed, pressure-applying position. The compression devices each comprise at least one spring interposed between the compression plate and at least one of the plurality of package caps. Each of the compression devices is designed to uniformly distribute compressive force on at least one of the plurality of package caps when the compression plate is in the closed position.

In an alternate embodiment, the alignment plate further comprises a plurality of fingers extending in the direction of the tray and designed to hold the cap in precise alignment with the substrate. Also, in another embodiment, the removable tray is a "JEDEC Tray" conforming to the JEDEC Tray Standard. In yet another embodiment, each of the compression devices further comprises a pressure plate sized to uniformly distribute compressive force from at least one spring onto one or more of the plurality of package caps.

In accordance with the present invention, a method is also provided for simultaneously assembling a plurality of multi-layered ceramic packages each comprising a substrate and a cap. The method comprises applying an adhesive component to each of the packages and loading each of the substrates in a tray having a plurality of cavities each sized to accept one of the plurality of packages.

Next, the loaded tray is placed on a baseplate. An alignment plate having a plurality of openings extending therethrough is aligned with the tray. A cap is placed over each of the substrates in the cavities so that each of the alignment plate openings contains at least a portion of one of the caps, and each of the caps is aligned with one of the substrates in the plurality of cavities in the tray.

Pressure is applied on each of the caps and on the alignment plate by securing a hinged top plate to the base plate. The top plate includes a plurality of springs aligned with the alignment plate and with the alignment plate openings. Finally, the adhesive component is cured while the packages are in the cavities and while pressure is applied to the caps, thus adhering the caps to the substrates.

Before applying pressure to each of the caps, a pressure plate may be placed on top of each cap. Preferably the top plate is hinged to the base plate in a book-like configuration and includes a plurality of springs attached thereto, so that closing the top plate aligns one or more of the plurality of springs with the alignment plate and one spring with each pressure plate.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

Figure 1:
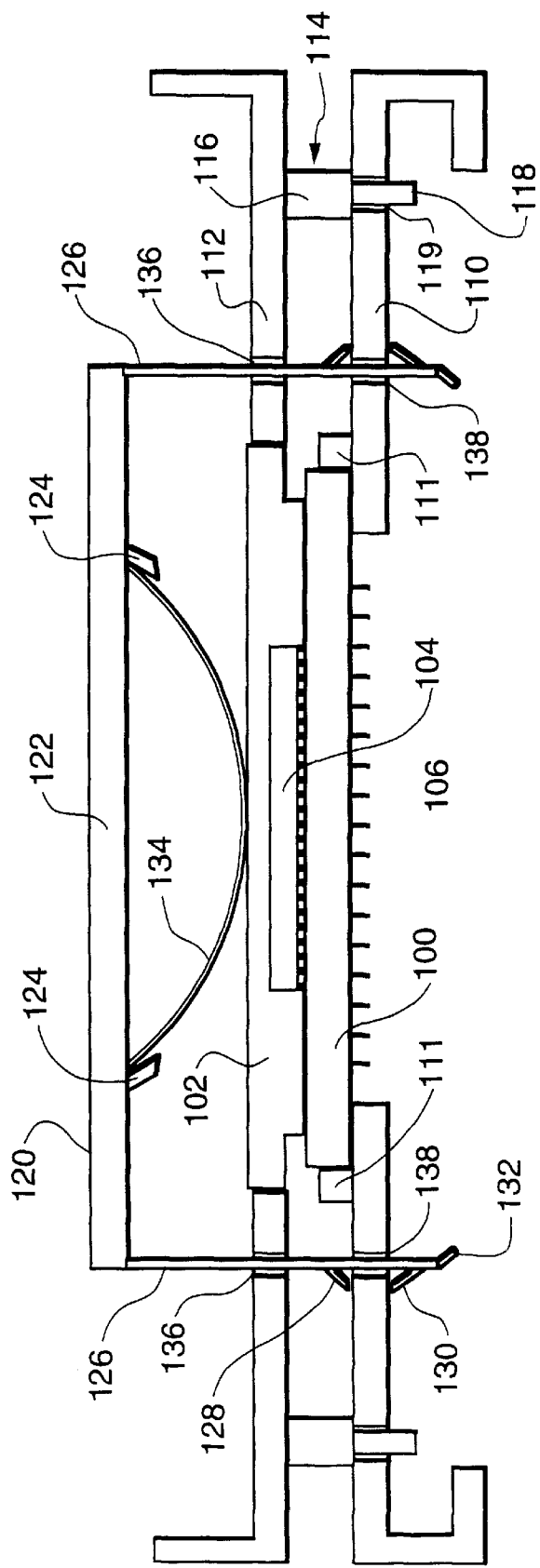
FIG. 1 shows a cross section of a typical stamped fixture of the prior art.
Figure 2:
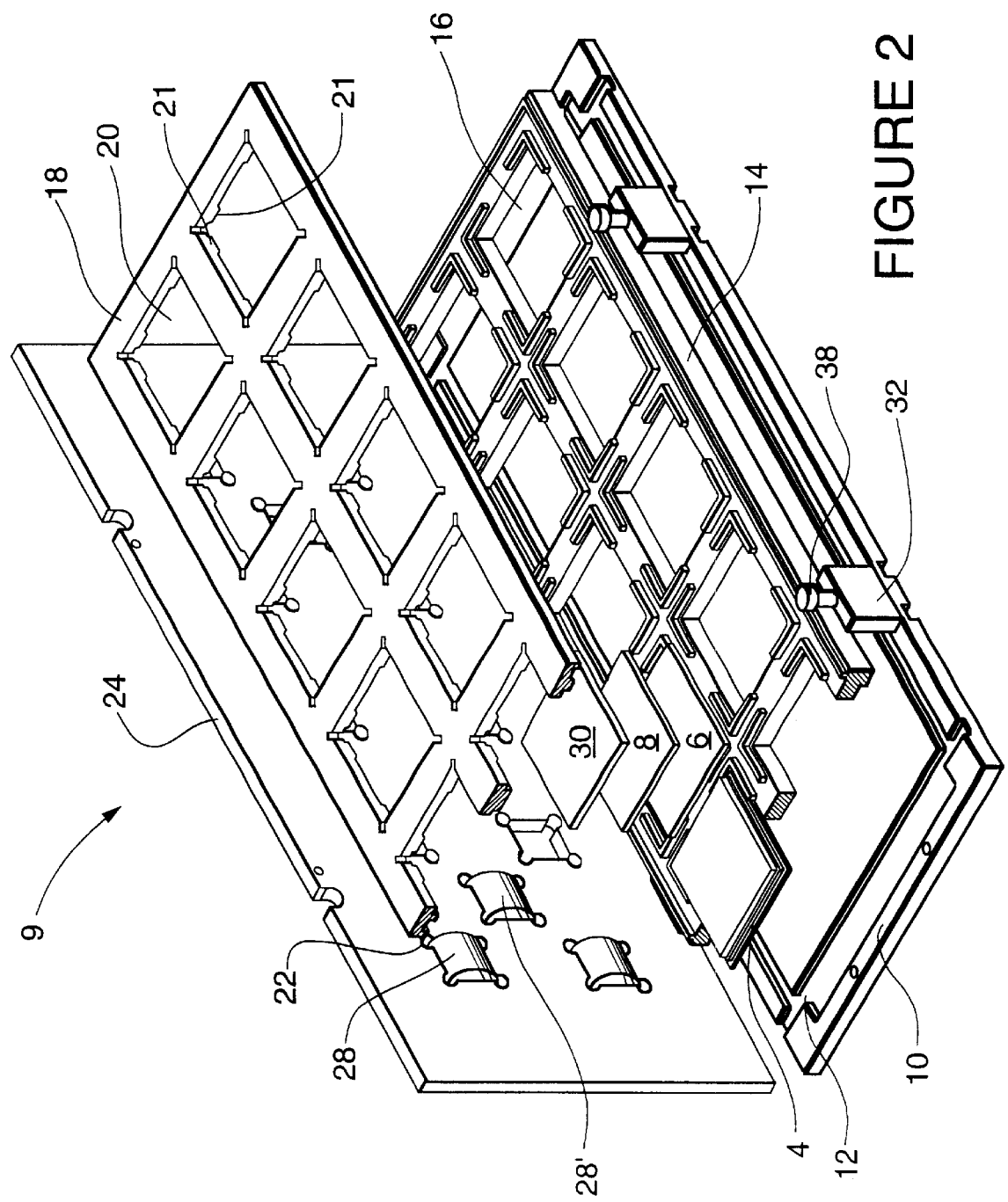
FIG. 2 shows an exploded view of a preferred embodiment of a fixture in accordance with the present invention in an open position.
Figure 3:
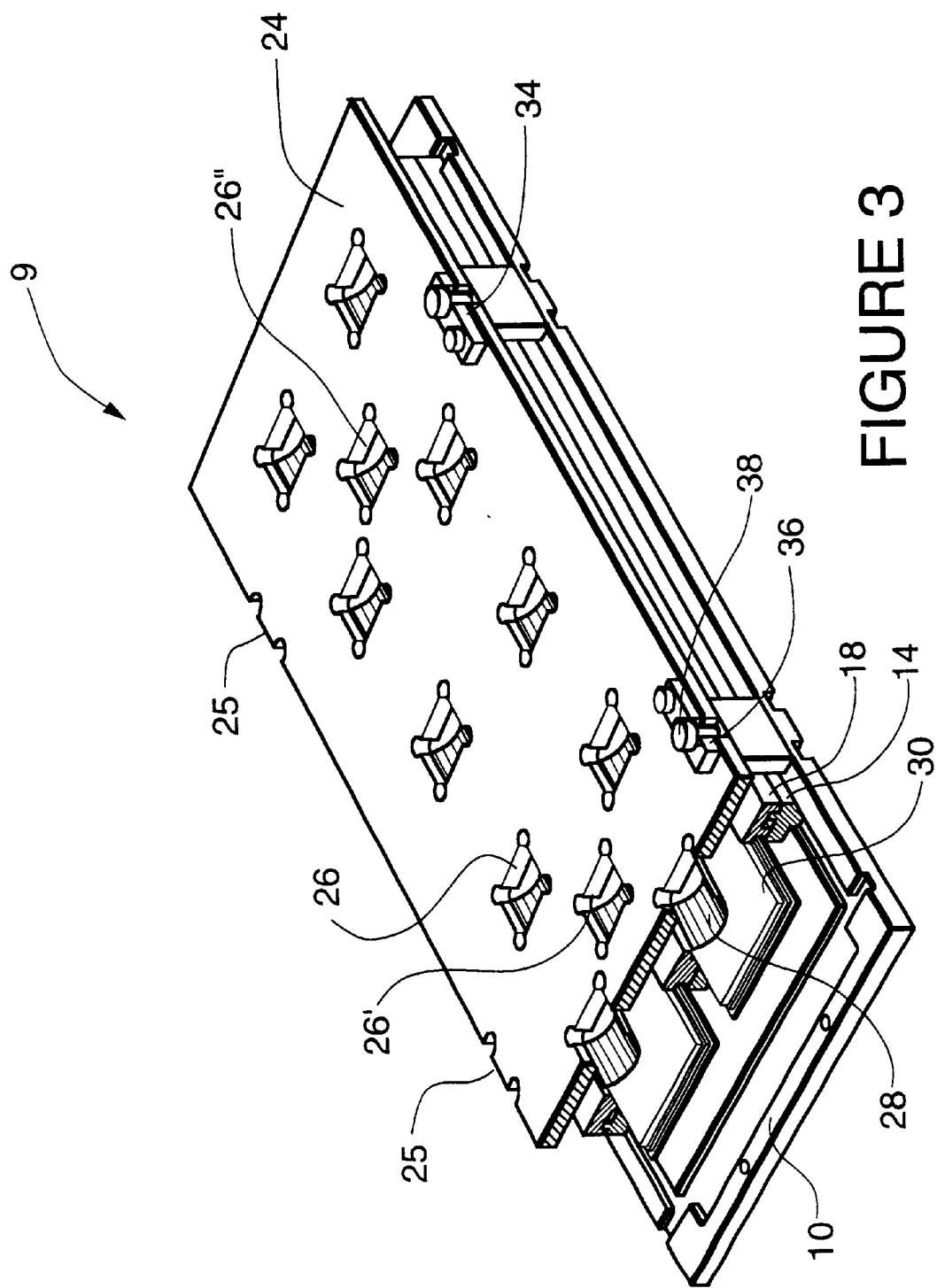
FIG. 3 shows a cut-away view of a preferred embodiment of the fixture of the present invention in a closed position.
Figure 4:
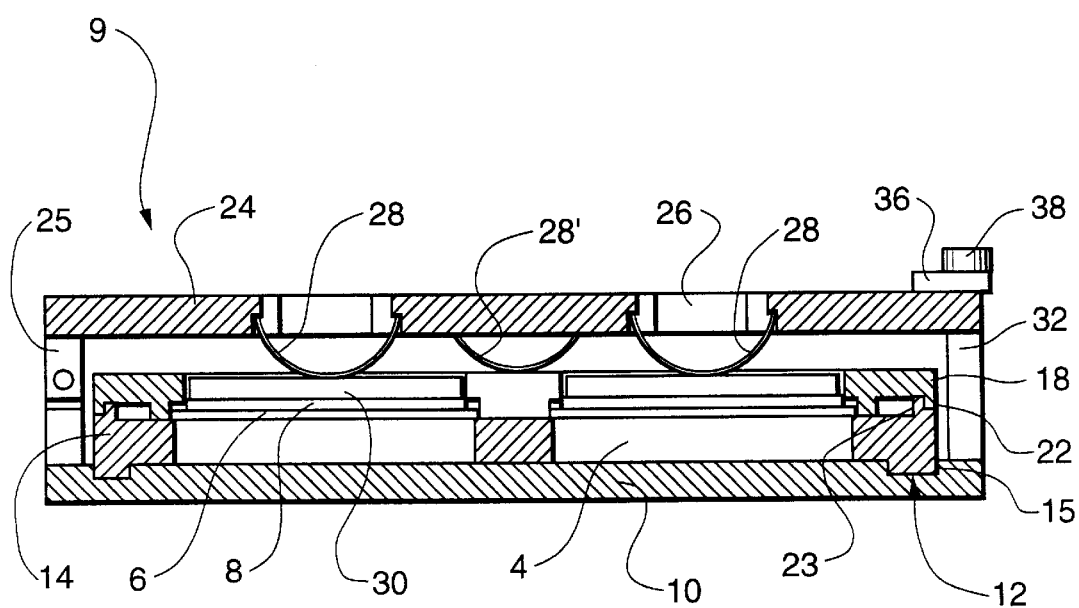
FIG. 4 shows a cross-sectional view of a preferred embodiment of the fixture of the present invention in a closed position.

Referring now to the drawing, in which similar numbers indicate the same elements in all figures, FIGS. 2, 3, and 4 show an embodiment of the present invention used to manufacture multi-layer ceramic (MLC) packages, or modules 4, consisting of a substrate (bottom) 6, and a cap (top) 8. The fixture 9 for assembling these modules consists of a baseplate 10, preferably constructed of one-quarter inch thick aluminum, preferably having a perimeter slot 12 milled in it. A tray 14 fits onto baseplate 10, its precise location being directed by aligning bottom ridge 15 into slot 12. Tray 14 is preferably a "JEDEC tray," meaning that it conforms to the Tray Standard of the JEDEC. Tray 14 has a plurality of cavities 16, in this case ten such cavities, each adapted to fit substrate 6.

Alignment plate 18 fits on top of tray 14. Alignment plate 18 also has a plurality of openings 20, in this case ten such openings, each opening having an associated plurality of fingers 21. Each opening is adapted to receive cap 8 and each associated plurality of fingers is adapted to accept substrate 6, thus precisely aligning each cap over its respective substrate to tight tolerances, if necessary. In a preferred embodiment, the alignment plate also has a bottom lip 22 along its perimeter that fits together with top ridge 23 of tray 14, thus locating the alignment plate in relation to tray 14.

Compression plate 24 pivotably attaches to baseplate 10, preferably with a hinge 25. Compression plate 24 has a plurality of receptacles 26, each adapted to fit a leaf spring 28. A pressure plate 30 stacks on top of each module assembly 4, on top of cap 8. Although the illustrated embodiment uses leaf springs, and leaf springs are preferred, other springs such as coil springs can be used.

Each module assembly has an individual pressure plate with an individual spring placed on top of it in the preferred embodiment. A single pressure plate can be used having multiple contacts, however, each contact uniformly distributing compressive force to a module assembly. Such a configuration can use less than one spring for every module, or even a single spring for the single pressure plate. A variation of this configuration includes more than one pressure plate but fewer than one per each module, each plate distributing the force of one or more springs on more than one module, thus presenting numerous combinations of pressure plates and springs, all within the scope of the present invention.

In either the multi-contact pressure plate configuration or in the configuration having an individual pressure plate for each module, each spring may be attached to the pressure plate rather than to the compression plate, so long as it is interposed between the compression plate and the pressure plate. The pressure plates may be excluded altogether, and each spring may directly contact each module assembly. In a preferred embodiment, however, the pressure plate is used especially for thin cap constructions that potentially could be deformed by direct contact with the spring.

Compression plate 24 and baseplate 10 are hinged together in the shape of a book. When the hinged compression plate 24 is closed like the cover of a closed book, the springs 28 compress against pressure plates 30 and compress together cap 8 and substrate 6. The compression plate is prevented from closing too tightly by stops 32. Once closed, the fixture is prevented from opening by latch assembly 34. Latch assembly 34 includes a latch gate 36 and a latch pin 38.

In a preferred embodiment, compression plate 24 also includes two additional receptacles 26' and 26", each adapted to contain a leaf spring 28'. The location of the leaf spring 28' is such that when the compression plate closes, the spring 28' presses against alignment plate 18 rather than against pressure plate 30, thus holding the alignment plate in place when the fixture is closed. In a preferred embodiment, the configuration of receptacles 26' and 26" is identical to receptacles 26. Similarly, the properties of springs 28' are identical to the properties of springs 28. In an alternate embodiment, however, the springs 28' and corresponding receptacles may be different than the combination used for compressing the modules.

Springs 28 and 28' are preferably detachable from receptacles 26, 26', and 26", respectively, so that springs of differing compressive forces may be used for assembly of modules having differing compressive requirements or differing thicknesses. Similarly, the plate stops 32 and corresponding latch pins 38 may be replaceable or merely adjustable by machining or shimming them to a different height to accommodate modules of differing thicknesses. Thus, any change in height of the module may be accommodated by changing the springs of the present invention or, if necessary, by shimming or cutting down the hinges or spacers, whereas the prior art would require a retooled set of clips.

The tray, although shown as a JEDEC tray with ten cavities in the present embodiment, can be any tray having any number cavities of any size or shape. Trays and corresponding alignment plates adapted for modules having differing footprints are interchangeable within the same fixture. Because the tray according to the present invention is sized to loosely receive each substrate, however, it can accommodate a wide range of bottom dimensions, and thus only the alignment plate needs to be retooled for most new footprints.

The fixture of the present invention also permits replacement of the compression plate with a corresponding plate supporting a different spring configuration to match a tray configuration having a different number of modules, if necessary.

The fixture according to the present invention is used in the manufacture of multi-layer ceramic modules as detailed below. Substrates 6 are loaded into tray 14, which is preferably a JEDEC tray. These substrates may already be prepared with an appropriate adhesive component, or the adhesive component may later be applied to the substrates while in the tray. The adhesive component may include any combination of underfill, thermally conductive or other pastes, and/or seals or other adhesives. In a preferred embodiment, the adhesive component includes a chip underfill applied around and thereby wicking under the chip, a thermally conductive paste on top of the chip, and a seal adhesive for the contact area where cap 8 contacts substrate 6.

The loaded tray is loaded into the baseplate 4 of fixture 9. Next, alignment plate 18 is placed on the tray, aligning bottom lip 22 with the tray top ridge 23, and thus aligning fingers 21 with substrates 6. Caps 8 are next placed in the alignment plate openings 20, thus precisely aligning caps 8 with substrates 6. A pressure plate 30 is then placed in each opening 20 on top of each cap 8. The hinged compression plate 24 is then closed and prevented from over-pivoting by stops 22. The plate is secured in the closed position by latch assembly 36. In the closed position, each spring 28 compresses a corresponding pressure plate 30 and thus places module assembly 4 under a uniform compressive force holding cap 8 to substrate 6. In addition, springs 28', when present, compress alignment plate 18 to hold it in place.

The loaded fixture 9 is maintained in a closed position while the adhesive component is cured to permanently bond substrate 6 to cap 8. Preferably, the adhesive component applied to the substrate is cured by heating. The curing step comprises placing the fixture in an oven at a specified temperature for a specified time until the adhesive component is cured. Numerous fixtures may be stacked on top of one another in the oven to maximize available area. In an alternative embodiment, curing the adhesive component may merely require a certain amount of time, in which case the curing step entails allowing the requisite amount of time to pass before the fixture is opened and the modules are removed.

Removal of the compressive force in the present invention merely entails opening the cover and lifting off the pressure plates. Because the present invention uses a removable tray, the entire tray of finished modules may then be removed from the fixture. In a preferred embodiment using a JEDEC tray, the tray is compatible with the handling equipment of many module end users, who can accept the loaded tray of modules directly for use in their manufacturing process.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed is:

1. A method for simultaneously assembling a plurality of multi-layered ceramic packages each comprising a substrate and a cap, said method comprising:

(a) applying an adhesive component to each of said packages;

(b) loading each of said substrates in a tray having a plurality of cavities each sized to accept one of said plurality of packages;

(c) placing the loaded tray on a baseplate;

(d) aligning an alignment plate having a plurality of openings extending therethrough with said tray;

(e) placing a cap over each of said substrates in said cavities so that each of said openings in the alignment plate contains at least a portion of one of said caps and each of said caps is aligned with one of the substrates in the plurality of cavities in the tray;

(f) applying pressure on each of said caps and said alignment plate with a compression plate and at least one compression device, each compression device comprising at least one spring interposed between the compression plate and the caps; and (g) curing said adhesive component while said packages are in said cavities and while pressure is applied to said caps with said compression plate, thereby adhering said caps to said substrates.

2. The method of claim 1 wherein the compression device comprises at least one pressure plate, the method further comprising, before step (f) of applying pressure on each of said caps, the step of placing the pressure plate between the at least one spring and said caps.

3. The method of claim 1 wherein step (b) comprises loading the plurality of substrates in a tray conforming to the Joint Electronic Device Engineer Council Tray Standard.

4. The method of claim 2 wherein each compression device comprises a spring and a pressure plate, the method further comprising, before step (f) of applying pressure on each of said caps, the step of placing one pressure plate in each alignment plate opening over each cap.

5. The method of claim 1 wherein the compression plate is pivotably attached to the baseplate and is moveable between an open position and a closed pressure-applying position, in which step (f) further comprises pivoting said compression plate into said closed position.

6. The method of claim 5 wherein step (f) further comprises securing said compression plate in said closed position with a latch assembly connected to said compression plate and to said baseplate.

7. The method of claim 5 further comprising the step (h) of pivoting said compression plate into said open position and removing said packages.

8. The method of claim 7 wherein removing said packages in step (h) comprises removing said entire tray.

9. The method of claim 1 wherein said compression plate, said compression devices, said baseplate, said alignment plate, and said tray comprise a fixture, wherein curing the adhesive component in step (g) comprises placing the fixture, loaded with said caps and said substrates, into an oven.

10. The method of claim 9 wherein step (g) further comprises stacking a plurality of said fixtures one on top of another in the oven.

* * * * *